(12) United States Patent
Yen et al.

(10) Patent No.: US 6,686,279 B2
(45) Date of Patent: Feb. 3, 2004

(54) METHOD FOR REDUCING GOUGING DURING VIA FORMATION

(75) Inventors: Daniel Yen, Singapore (SG); Wei Hua Cheng, Singapore (SG); Yakub Aliyu, Basking Ridge, NJ (US); Lee Yuan Ping, Singapore (SG)

(73) Assignee: Chartered Semiconductor Manufacturing Limited, Singapore (SG)

( * ) Notice: Subject to any disclaimer, the term of this patent is extended or adjusted under 35 U.S.C. 154(b) by 0 days.

(21) Appl. No.: 10/114,680

(22) Filed: Apr. 1, 2002

(65) Prior Publication Data

US 2003/0186542 A1 Oct. 2, 2003

(51) Int. Cl.$^7$ ............................................... H01L 21/44
(52) U.S. Cl. ...................... 438/672; 438/723; 438/437; 438/622; 438/597
(58) Field of Search ............................ 438/437, 672, 438/622, 624, 723, 787, 789, 637, 597, 700, 639, 688

(56) References Cited

U.S. PATENT DOCUMENTS 5,244,837 A * 9/1993 Dennison ..................... 437/195
5,926,738 A * 7/1999 Cronin et al. ................ 438/688
6,100,183 A * 8/2000 Lu et al. ...................... 438/637
6,180,518 B1 * 1/2001 Layadi et al. ................ 438/639
6,255,207 B1 * 7/2001 Jang ............................ 438/597
6,399,512 B1 * 6/2002 Blosse et al. ................ 438/723
2002/0155695 A1 * 10/2002 Lee et al. .................... 438/622

\* cited by examiner

*Primary Examiner*—Caridad Everhart
*Assistant Examiner*—Renzo N Rocchegiani

(57) ABSTRACT

A method and apparatus for reducing gouging during via formation. In one embodiment, the present invention is comprised of a method which includes forming an opening into a substrate. The opening is formed extending into the substrate and terminating on at least a portion of a target to which it is desired to form an electrical connection. After the formation of the opening, the present embodiment lines the opening with a liner material. In this embodiment, the liner material is adapted to at least partially fill a portion of the opening which is not landed on the target. The liner material of the present embodiment prevents substantial further etching of the substrate conventionally caused by the opening being at least partially unlanded on the target. Next, the present embodiment subjects the liner material to an etching process such that the liner material is substantially removed from that region of the target where the opening was landed on the target. In this embodiment, liner material residing in the region where the opening is unlanded prevents further gouging of the substrate proximate to the target.

14 Claims, 11 Drawing Sheets

METHOD FOR REDUCING GOUGING DURING VIA FORMATION

FIELD OF THE INVENTION

The present claimed invention relates to the field of semiconductor processing. More particularly, the present claimed invention relates to a method for forming vias.

BACKGROUND ART

As semiconductor geometries continue to become smaller and smaller, new difficulties arise in the fabrication of the correspondingly smaller features. As one example, when device sizes decrease in size (in order to form more devices on each wafer), features such as vias have critical dimensions (CDs) which become considerably smaller. The reduced CD of, for example, a via has certain drawbacks associated therewith. Referring now to Prior Art FIG. 1A, a side sectional view of a via having a reduced CD is shown. In Prior Art FIG. 1A, a substrate 100 has a via 102 formed therein. In the structure of Prior Art FIG. 1A, the critical dimension (CD) is shown as the width, W, of via 102. Furthermore, it is important to note that the depth, D, of via 102 is much larger than the CD or width, W, of via 102. Hence, via 102 is typically referred to as a high aspect ratio via.

Referring now to Prior Art FIG. 1B, as the CD of via 102 decreases, significant manufacturing difficulties arise. For example, landing of the via on an underlying target such as for example metal layer (M2) 106, becomes increasingly difficult. That is, during the formation of via 102, a portion 108 of via 102 "lands" on target 106. As shown in Prior Art FIG. 1B, the portion of the bottom of via 102 which is disposed over target 106 is referred to as "landed". However, in the aforementioned smaller geometries, portion of vias are often "unlanded". In Prior Art FIG. 1B, portion 110 of via 102 is "unlanded". That is, portion 110 of the bottom of via 102 does not directly reside over target 106. As will be discussed below, conventionally unlanded portions of vias (e.g. portion 110 of via 102) have severe disadvantages associated therewith.

With reference now to Prior Art FIG. 1C, an example of a drawback associated with a conventional unlanded via is shown. More particularly, Prior Art FIG. 1C illustrates a condition referred to as "gouging". Gouging, for purposes of the present application, refers to significant excessive and unwanted etching proximate to the unlanded portion of the via. In the example of Prior Art FIG. 1C, gouging is schematically depicted in region 112 proximate to unlanded portion 110 of via 102. As mentioned above, such gouging has significant drawbacks and disadvantages associated therewith. For example, gouging of the substrate proximate to target 106, creates difficulties in subsequent barrier metal deposition and conductive material filling of via 102. Additionally, under some circumstances, the gouging may reach or closely approach an underlying layer such as, for example, metal layer (M1) 114. Under such circumstances, it is possible for a short (as depicted by arrow 116) to occur between the target 106 and the underlying layer 114. Such shorting will almost certainly adversely affect the semiconductor device in which the short occurs.

One attempt to eliminate gouging and the complications caused thereby is recited in U.S. Pat. No. 6,020,258 entitled "Method for Unlanded Via Etching Using Etch Stop", to Yew et al. filed Dec. 1, 1997. In the Yew et al. reference, a separate etch stop layer is formed into the substrate, into which the via is to be formed. The separate etch stop layer is formed at approximately the same level as the intended target to prevent the via from being etched substantially deeper than the depth of the target, even if the via is partially unlanded. Although such an approach has utility in certain processes, such an approach is not without problems. As one example, the approach of the Yew et al. reference requires the formation of the etch stop layer within the substrate. Such an etch stop layer requires that the formation of the substrate occur in at least two different steps. That is, at least a first step is required to deposit/grow the substrate onto which the etch stop layer is deposited, and at least a second step is required to deposit/grow the substrate which resides above the etch stop layer. Furthermore, the etch stop layer of the Yew et al. reference may complicate the process of etching through the substrate at locations other than proximate to the target.

Thus, a need exists for a method and apparatus for forming a via wherein the via is not subject to substantial gouging. A further need exists for a method and apparatus which meets the above need and which does not require the formation of a conventional etch stop layer within the substrate. Still another need exists for a method and apparatus which meets the above needs and which is compatible with existing semiconductor fabrication processes.

SUMMARY OF INVENTION

The present invention provides a method and apparatus for forming a via wherein the via is not subject to substantial gouging. The present invention further provides a method and apparatus which achieves the above accomplishment and which does not require the formation of a conventional etch stop layer within the substrate. The present invention also provides a method and apparatus which achieves the above accomplishment and which is compatible with existing semiconductor fabrication processes.

In one embodiment of the present invention, A method and apparatus for reducing gouging during via formation. In one embodiment, the present invention is comprised of a method which includes forming an opening into a substrate. The opening is formed extending into the substrate and terminating on at least a portion of a target to which it is desired to form an electrical connection. After the formation of the opening, the present embodiment lines the opening with a liner material. In this embodiment, the liner material is adapted to at least partially fill a portion of the opening which is not landed on the target. The liner material of the present embodiment prevents substantial further etching of the substrate conventionally caused by the opening being at least partially unlanded on the target. Next, the present embodiment subjects the liner material to an etching process such that the liner material is substantially removed from that region of the target where the opening was landed on the target. In this embodiment, liner material residing in the region where the opening is unlanded prevents further gouging of the substrate proximate to the target.

In yet another embodiment, the present invention includes the steps of the above-described embodiment and further includes the step of depositing a conductive material into the opening. In so doing, the conductive material is electrically coupled to the target. Furthermore, in the present embodiment, the liner material confines the conductive material proximate to the target.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

PRIOR ART

PRIOR ART

PRIOR ART

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
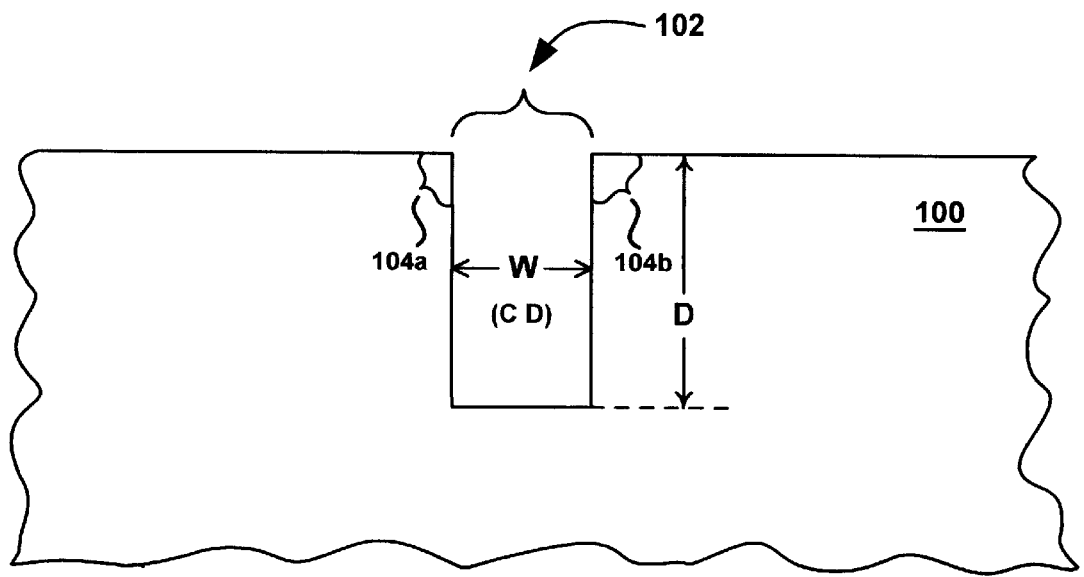
FIG. 1A is a side sectional view of a structure having a conventional high aspect ratio via formed therein proximate to a target.
Figure 1B:
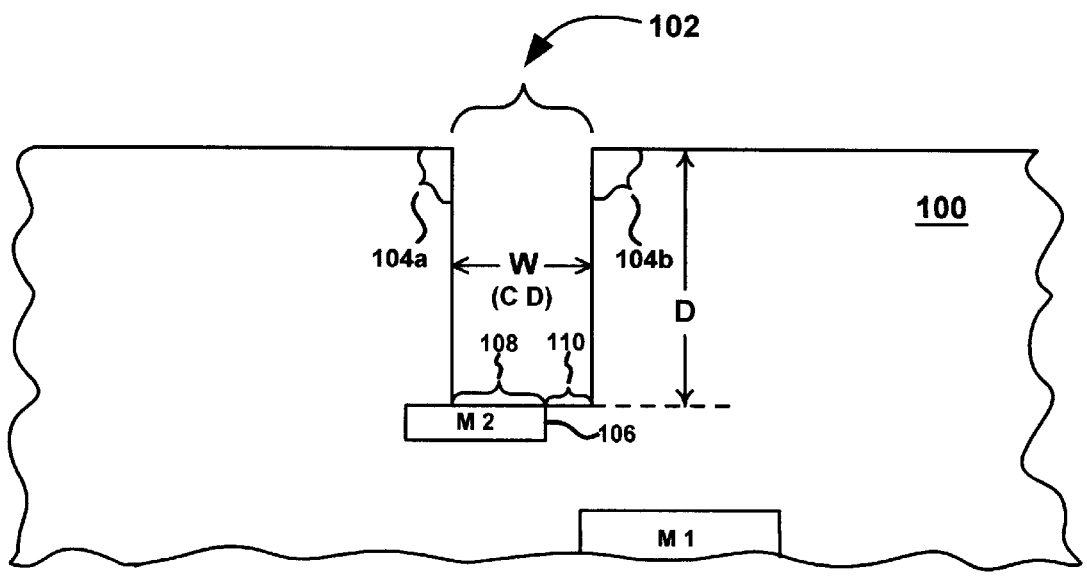
FIG. 1B is a side sectional view of a structure having a conventional high aspect ratio via formed therein proximate to a target wherein a portion of the conventional high aspect ratio via is unlanded.
Figure 1C:
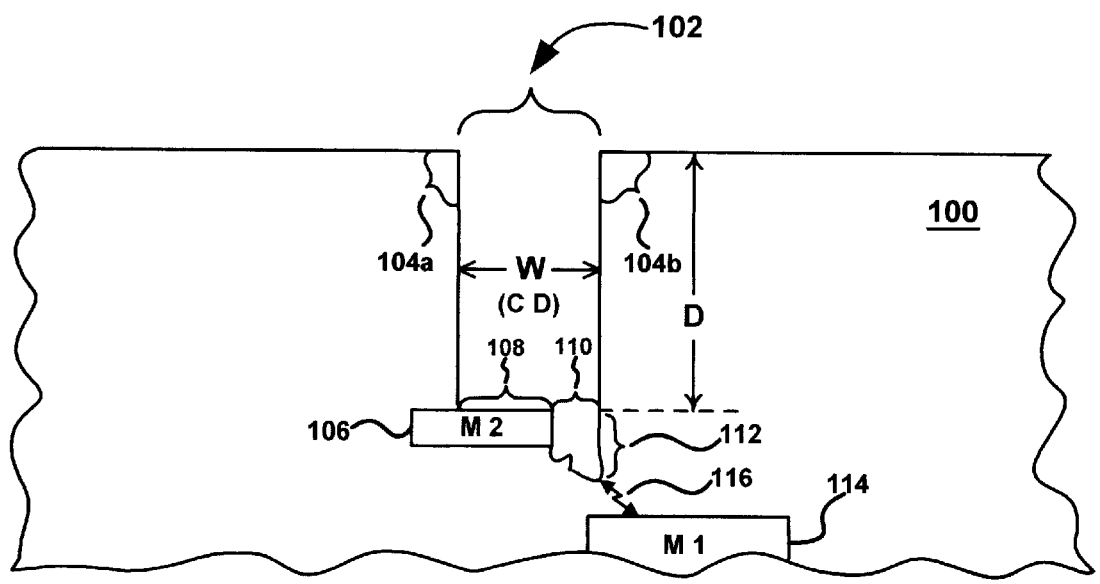
FIG. 1C is a side sectional view of a structure having a conventional high aspect ratio via formed therein proximate to a target wherein a portion of the conventional high aspect ratio via is unlanded and wherein gouging induced by the unlanded portion of the conventional high aspect ratio via is present.
Figure 2A:
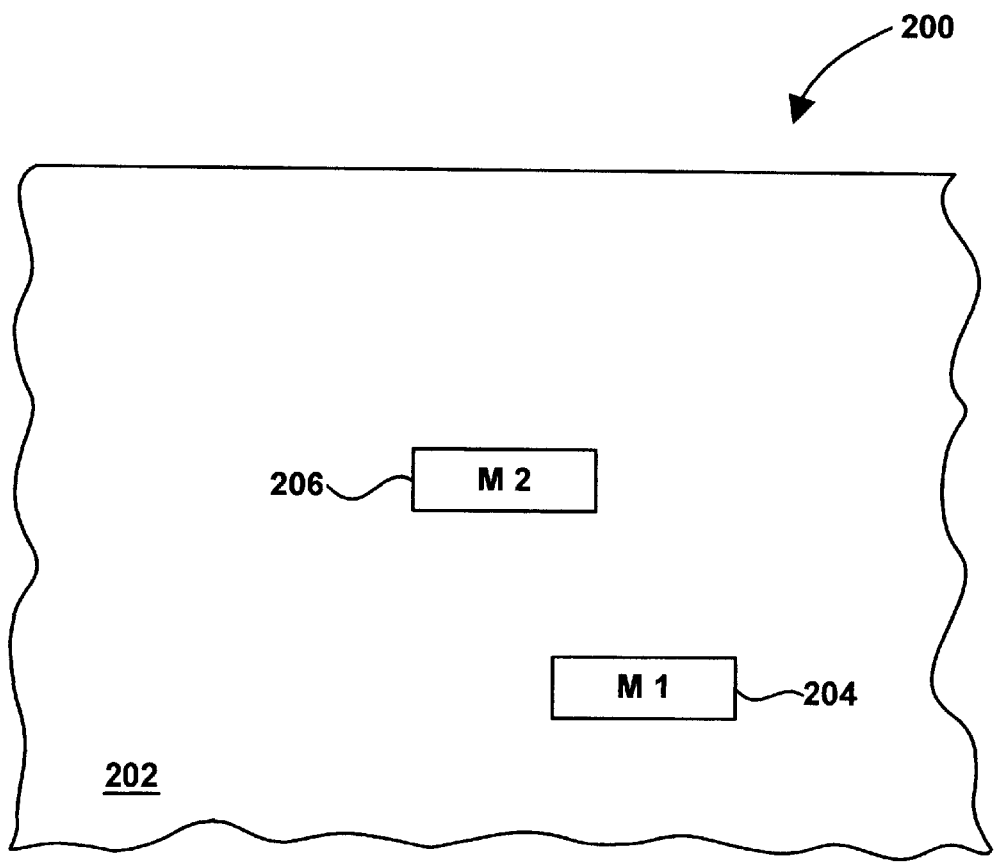
FIG. 2A is a side sectional view of a substrate, including metal layers, into which a via is to be formed in accordance with one embodiment of the present claimed invention.
Figure 2B:
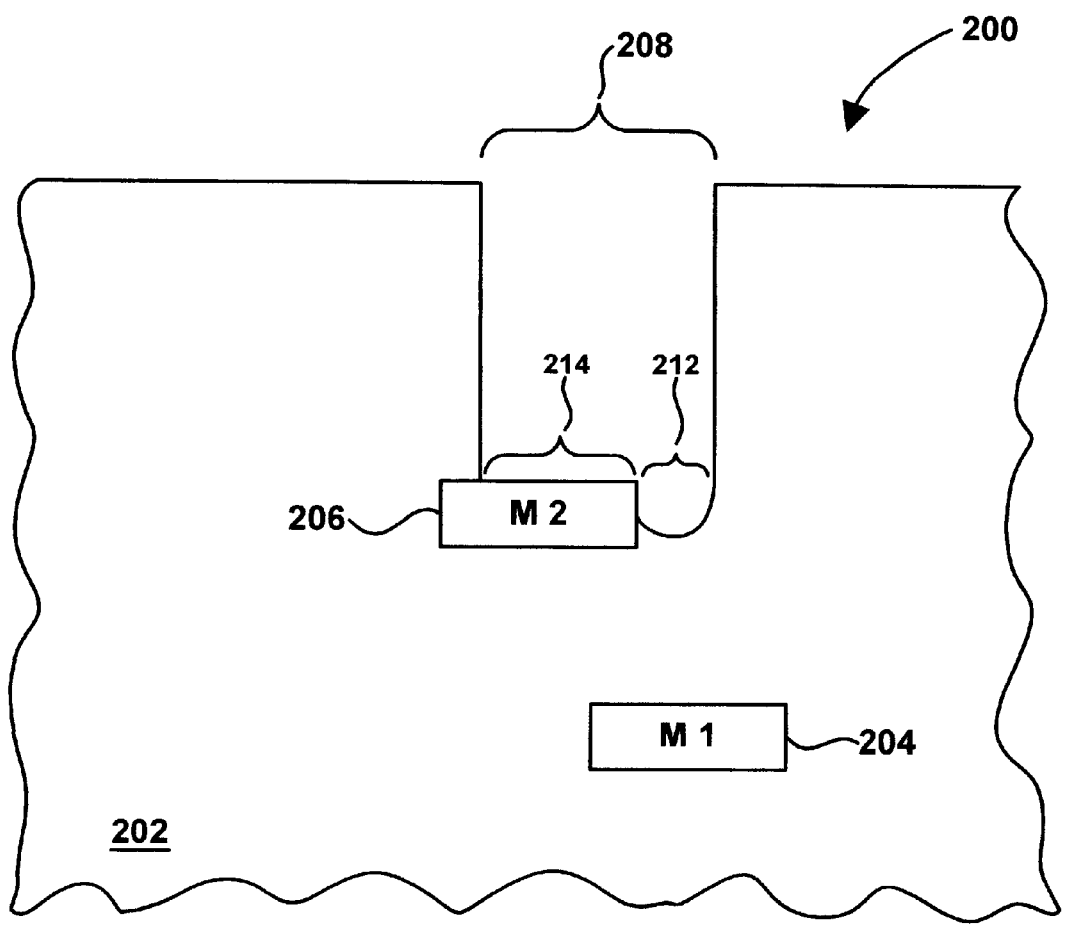
FIG. 2B is a side sectional view of the structure of FIG. 2A having a via formed therein in accordance with one embodiment of the present claimed invention.
Figure 2C:
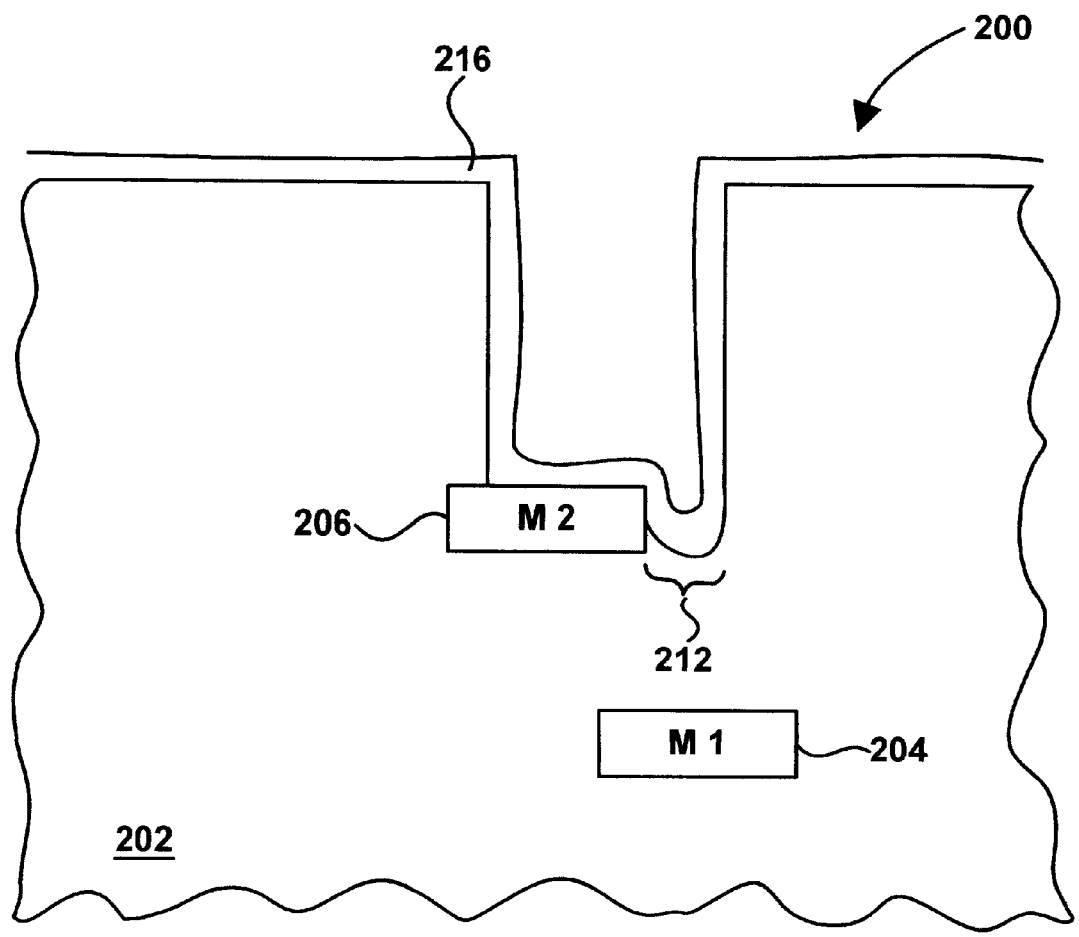
FIG. 2C is a side sectional view of the structure of FIG. 2B wherein a liner material is disposed within the via in accordance with one embodiment of the present claimed invention.
Figure 2D:
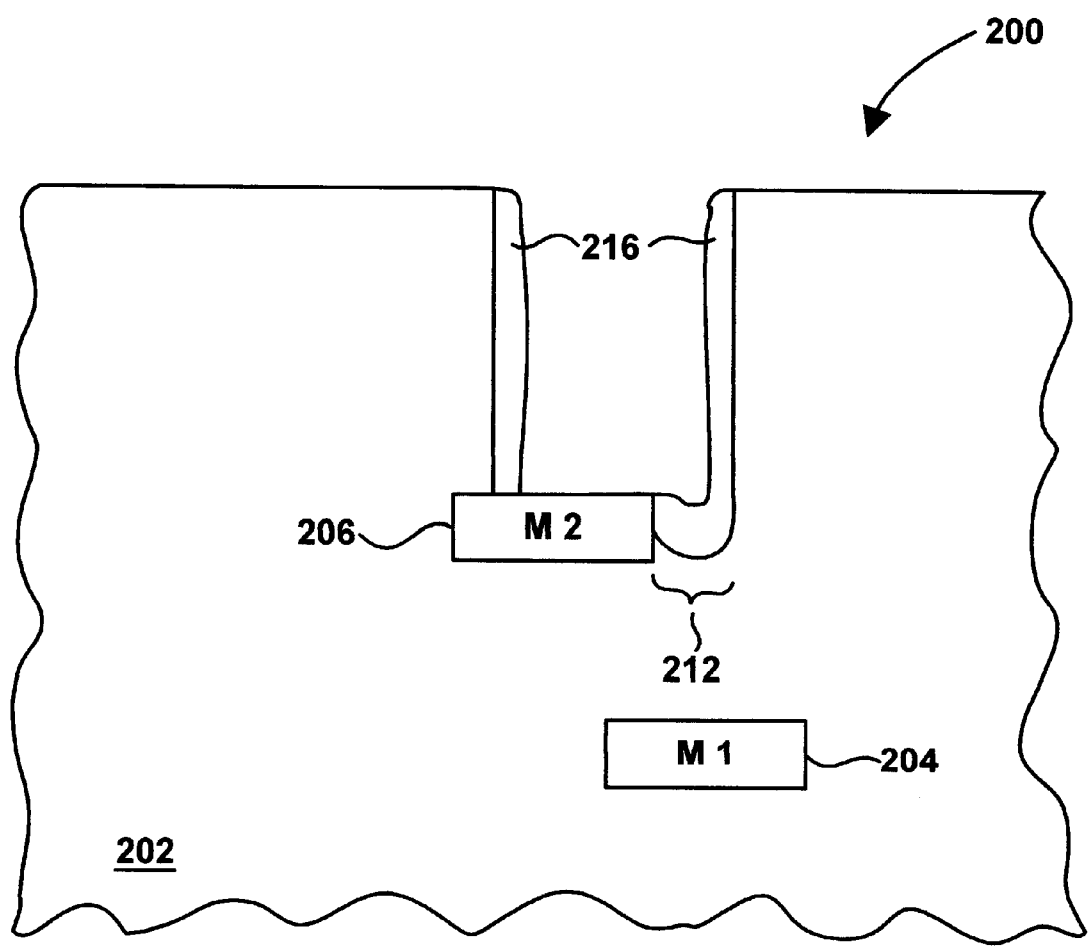
FIG. 2D is a side sectional view of the structure of FIG. 2C wherein the liner material has been subjected to an etching process in accordance with one embodiment of the present claimed invention.
Figure 2E:
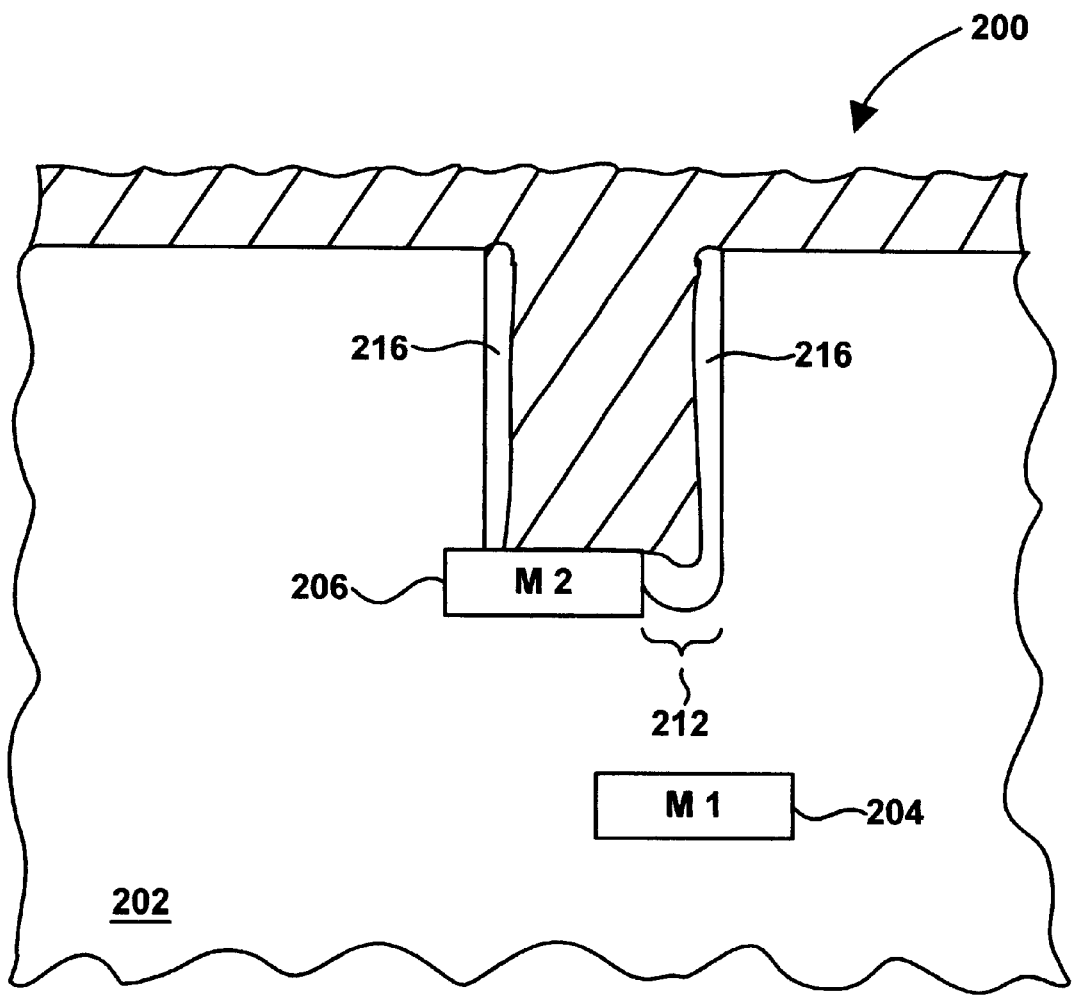
FIG. 2E is a side sectional view of the structure of FIG. 2D wherein a conductive material is disposed with the lined via in accordance with one embodiment of the present claimed invention.
Figure 2F:
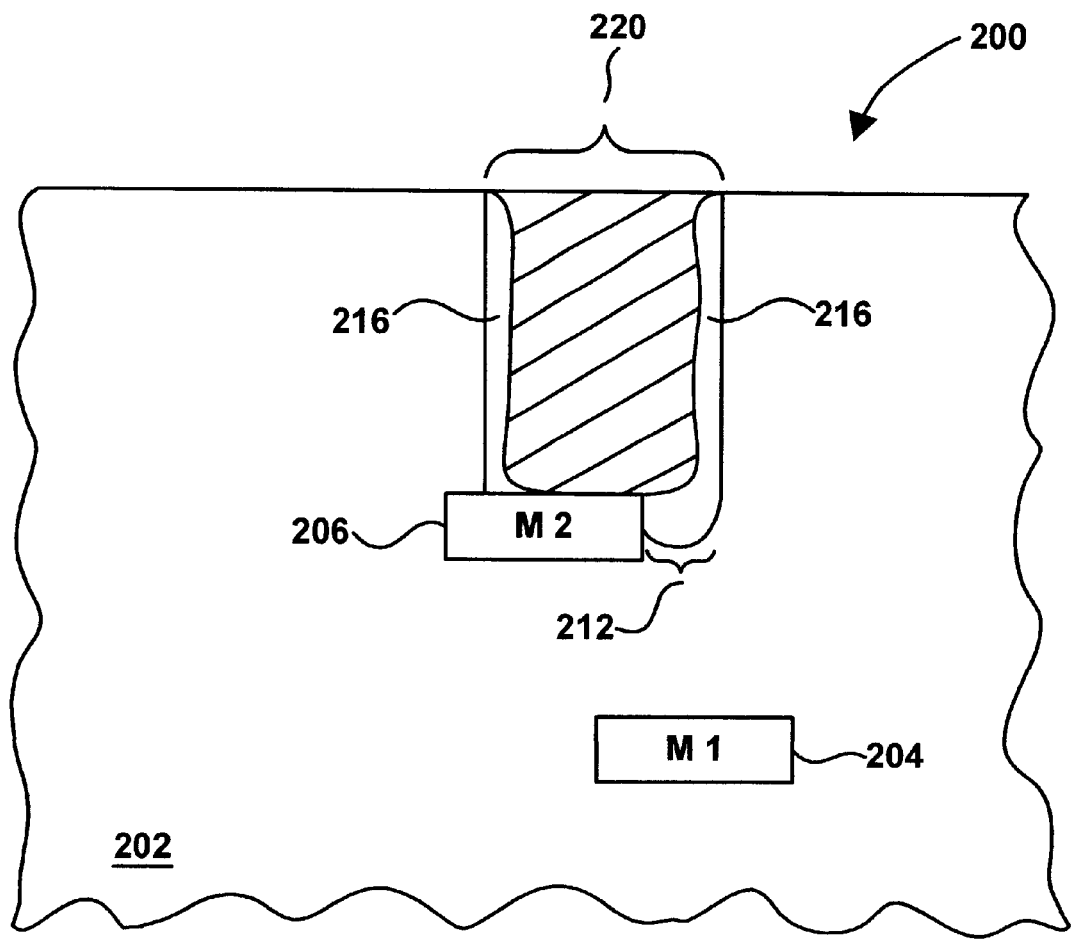
FIG. 2F is a side sectional view of the structure of FIG. 2E wherein the conductive material has been subjected to a planarization process in accordance with one embodiment of the present claimed invention.
Figure 3:
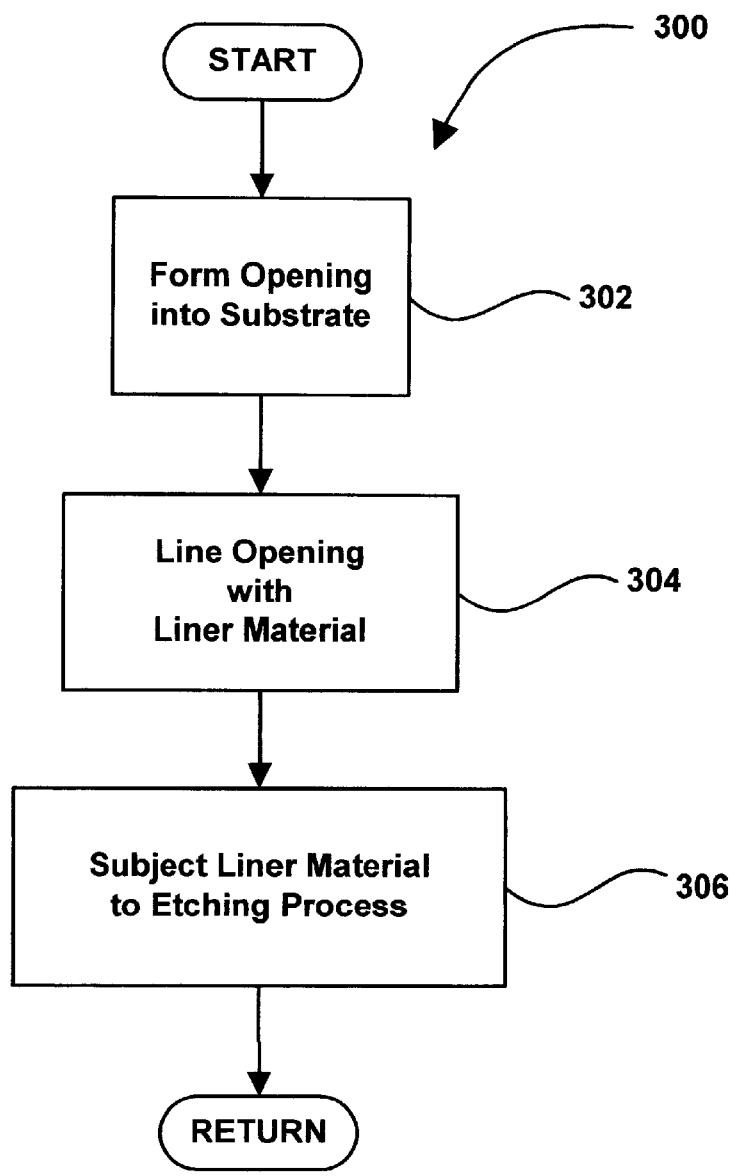
FIG. 3 is a flow chart of steps performed in accordance with one embodiment of the present claimed invention.
Figure 4:
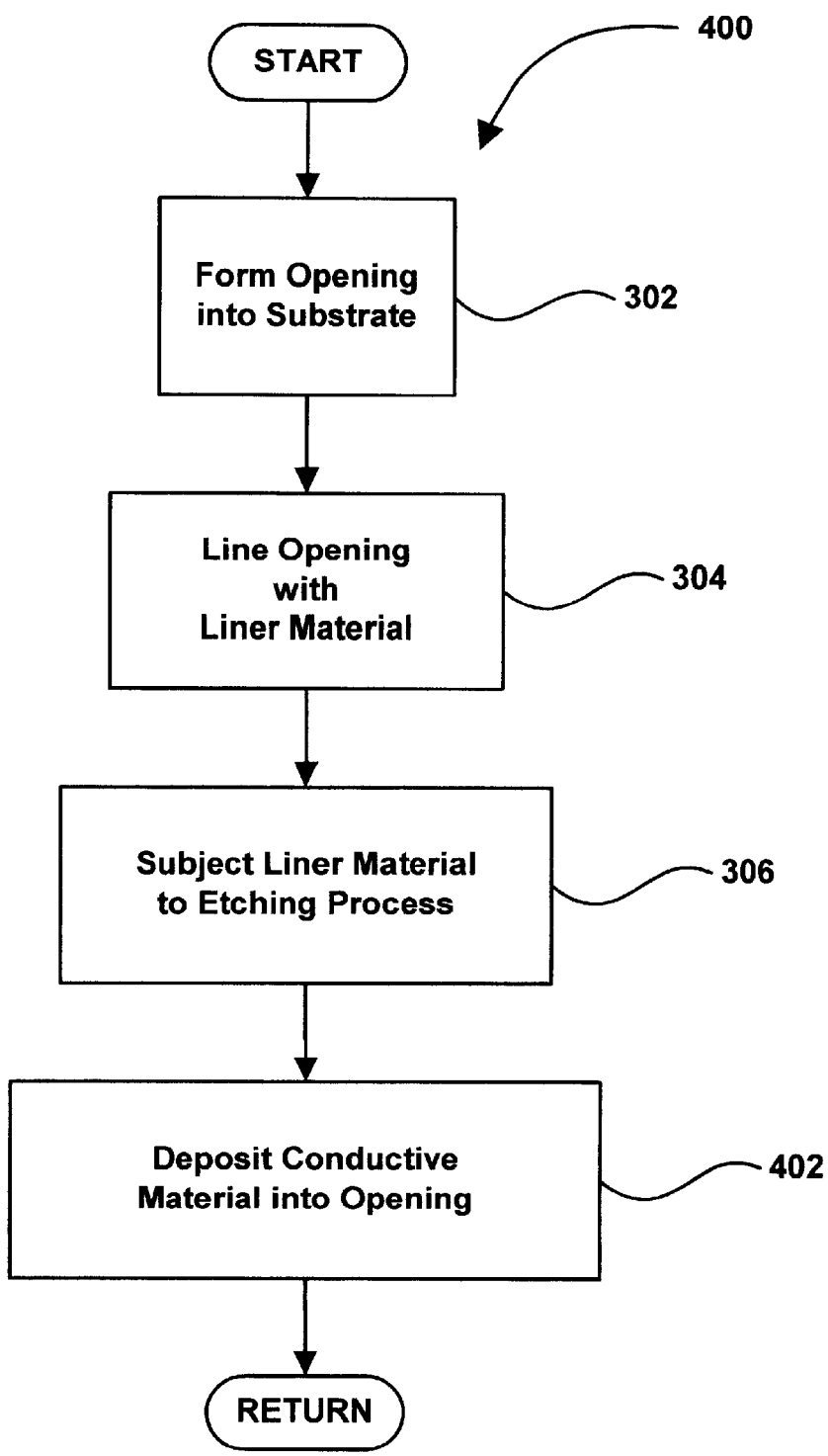
FIG. 4 is a flow chart of steps performed in accordance with another embodiment of the present claimed invention.

FIGS. 2A–2F provide side sectional views of the structure created according to embodiments of the method of the present invention as set forth in the flow charts of FIGS. 3 and 4. For purposes of clarity, the following discussion will utilize the side sectional views of FIGS. 2A–2F in conjunction with the flow charts of FIGS. 3 and 4 to clearly describe the embodiments of the present invention. Flow chart 300 of FIG. 3 begins with step 302. At step 302, the present embodiment forms an opening into a substrate. As will be described in detail below, the via to be formed in accordance with the present embodiment is a high aspect ratio via which is intended to be landed on a target to which it is desired to form an electrical connection. Unlike some conventional high aspect ratio vias, the via formed in accordance with the present invention will not induce substantial gouging of the substrate even when a portion of the via is unlanded. As mentioned above, a high aspect ratio via is referred to as such because the width or CD is considerably smaller than the depth, D, of the via. Furthermore, although the following discussion and examples specifically recite the formation of a high aspect ratio via, the present invention is also well suited to use with vias which are not defined as "high aspect ratio" vias.

Referring still to step 302 of FIG. 3, in the present embodiment, structure 200 includes a substrate 202 as shown in FIG. 2A which is comprised of an intermetal dielectric (IMD) material such as, for example, silicon dioxide. Although such an IMD material is recited in the present embodiment, the present embodiment is well suited to the use of any other material into which it is desired to form a high aspect ratio via. Other materials which are well suited for use as the first material include, but are not limited to, tetraethylorthosilicate (TEOS), fluorine-doped TEOS, and the like. In the present embodiment, the substrate 202 is any material into which it is desired to form a via. As will be understood, such vias are often formed to electrically couple conductive features (e.g. metal 1 and metal 2 layers) which are separated by a dielectric material. In the embodiment of FIG. 2A, structure 200 also includes a portion of a metal 1 layer 204, and a portion of a metal 2 layer 206 which are both disposed within substrate 202. Additionally, for purposes of the following discussion, it will be understood that it is desired to form a via which extends to a target (i.e. metal 2 layer 206, hereinafter referred to as target 206) such that an electrical connection can be made thereto.

With reference still to step 302, FIG. 2B shows a high aspect ratio via 208 which has been formed into substrate 202. In the present embodiment, high aspect ratio via 208 is partially unlanded with respect to target 206. That is, a portion 214 of the bottom of high aspect ratio via 208 is disposed at or just above the top surface of target 206, and another portion 212 is not disposed at or just above the top surface of target 206. Portion 212 of high aspect ratio via 208 is, therefore, referred to as unlanded with respect to target to 206. As mentioned above, in prior art approaches, continued etching, associated with conventional via formation processes, can result in substantial gouging of substrate 202 proximate to region 212. In fact, is some instances, such gouging can even result in portion 212 of the high aspect ratio via extending, or enabling a short from target 206, to metal 1 layer 204.

With reference now to step 304, the present embodiment then lines high aspect ratio via 208 with a liner material 216, shown in FIG. 2C. As shown in FIG. 2C, in the present embodiment, liner material 216 is a conformal material which cover the edges/sidewalls of high aspect ratio via 208, as well as the landed and unlanded bottom portions of high aspect ratio via 208. Also, in one embodiment of the present invention, liner material 216 is selected from the group consisting of oxide, nitride, and various low-k materials.

With reference still to FIG. 2C and step 304 of FIG. 3, in this embodiment, liner material 216 is adapted to at least partially fill portion 212 of high aspect ratio via 208. More specifically, in the present embodiment, liner material 216 is comprised of a material which has an etch selectivity with respect to substrate 202. That is, liner material 216 is comprised of a material that can be etched using an etching process wherein the etching process does not significantly etch substrate 202. In one embodiment, liner material 216 is comprised of an organic-based spin-on-glass material (e.g. HSQ, MSQ, and the like) which has an etch selectivity with respect to substrate 202. Although such a material is recited in the present embodiment, the present embodiment is well suited to the use of any other material for liner material 216 as long as the material has an etch selectivity with respect to substrate 202.

Additionally, in the present embodiment, liner material 216 is deposited to a depth which corresponds to the critical dimension, CD, of the high aspect ratio via to be formed. For example, in one embodiment, liner material 216 is deposited to a depth of approximately 10–30 percent of the CD of the high aspect ratio via to be formed. As an example, where high aspect ratio via 208 is to have a width or CD of 0.5 microns, liner material 216 will be deposited with a depth of approximately 0.05 to 0.15 microns (i.e. 500 to 1500 Angstroms). Although such a depth for second layer 212 of the second material is recited in the present embodiment, the present embodiment is well suited to depositing second layer 212 of the second material to various greater or lesser depths. More importantly, in the present embodiment, liner material 216 should conformally cover the edges of high aspect ratio via 208, and the unlanded and landed portions of the bottom of high aspect ratio via 208.

Referring now to step 306, the present embodiment then subjects liner material 216 to a etching process. In this embodiment, the etching process is performed such that liner material 216 is substantially removed from target 206. Additionally, in one embodiment, the etching of liner material 216 is performed using a highly anisotropic etching process to ensure that the etching process is substantially limited to that portion of the liner material which resides at the base of high aspect ratio via 208. Furthermore, in the present embodiment, the aforementioned etching process ceases once target 206 is substantially exposed. Thus, the present embodiment stops the etching process after target 206 is exposed and thereby prevents deleterious and excessive etching at unlanded portion 212 of high aspect ratio via 208. In so doing, the present embodiment reduces gouging of substrate 202 even when high aspect ratio via 208 is not completely landed on target 206. Also, in the present embodiment liner material 216 is also removed form the top surface of substrate 202.

Importantly, by providing a high aspect ratio via which is lined with liner material 216, high aspect ratio via 208, of the present embodiment, does not suffer from the significant gouging found in prior art processes. Also, the high aspect ratio via formation method of the present embodiment is readily manufactured using existing semiconductor fabrication processes. That is, the present embodiments are compatible with existing semiconductor fabrication processes. Furthermore, unlike some conventional approaches, the embodiments of the present invention do not require the formation of a conventional etch stop layer within substrate 202. Hence, the present embodiments, unlike some prior art approaches, do not require the formation of substrate 202 using at least two different steps. Additionally, as will be discussed below in conjunction with another embodiment of the present embodiment, the present invention enables the formation of an interconnect which does not suffer from significant gouging and the problems associated therewith.

With reference now to FIG. 4, a flow chart 400 is shown of steps performed in accordance with another embodiment of the present claimed invention in which an interconnect having reduced gouging thereof is formed. As shown in flow chart 400, the method of the present embodiment includes the steps and features of the above-described embodiment (i.e. as recited in steps 302–306, and shown in FIGS. 2A–2E). For purposes of brevity and clarity, a discussion of these steps is not repeated here. The method of the present embodiment includes an additional step 402 which is described below in detail.

At step 402, as illustrated in FIG. 2E, the present embodiment deposits a layer 218 of a conductive material above the structure of FIG. 2D and into high aspect ratio via 208. In one embodiment of the present invention, layer 218 of conductive material is comprised of a conductive metallic layer such as, for example, tungsten. Although such a conductive material is recited in the present embodiment, the present embodiment is well suited to the use of any other conductive material from which it is desired to form a metallized interconnect. Other materials which are well suited for use as the conductive material include, but are not limited to, aluminum, copper, various alloys, combinations of metals, and the like.

Additionally, as shown in FIG. 2F, the present embodiment completes the formation of the metallized interconnect by performing a planarization step to remove conductive material 218 from everywhere except within high aspect ratio via 208. As a result, the present embodiment provides a metallized interconnect which is substantially free of the substantial gouging associated with conventionally fabricated high aspect ratio vias.

Thus, the present invention provides a method and apparatus for forming a via wherein the via is not subject to substantial gouging. The present invention further provides a method and apparatus which achieves the above accomplishment and which does not require the formation of a conventional etch stop layer within the substrate. The present invention also provides a method and apparatus which achieves the above accomplishment and which is compatible with existing semiconductor fabrication processes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method for reducing gouging during via formation, said method comprising the steps of:
   a) forming an opening into a substrate, said opening extending into said substrate and terminating on at least a portion of a target to which it is desired to form an electrical connection;
   b) lining said opening with a liner material such that said liner material is adapted to at least partially fill a portion of said opening which is not landed on said target; and
   c) subjecting said liner material to an etching process such that said liner material is substantially removed from said at least a portion of said target to which it is desired to form said electrical connection, and such that gouging of said substrate when said opening is not completely landed on said target is reduced.

2. The method for reducing gouging during via formation as recited in claim 1 wherein said target is comprised of metal layer.

3. The method for reducing gouging during via formation as recited in claim 1 wherein said liner material is comprised of conformal material.

4. The method for reducing gouging during via formation as recited in claim 1 wherein said liner material is selected from the group consisting of oxide, nitride, and low-k materials.

5. The method for reducing gouging during via formation as recited in claim 1 wherein said etching process is comprised of a highly anisotropic etching process.

6. The method for reducing gouging during via formation as recited in claim 1 wherein said etching process of step c) ceases once said target is exposed.

7. A method for forming an interconnect with reduced gouging, said method comprising the steps of:
   a) forming an opening into a substrate, said opening extending into said substrate and terminating on at least a portion of a target to which it is desired to form an electrical connection;
   b) lining said opening with a liner material such that said liner material is adapted to at least partially fill a portion of said opening which is not landed on said target;
   c) subjecting said liner material to an etching process such that said liner material is substantially removed from said at least a portion of said target to which it is desired to form said electrical connection, and such that gouging of said substrate when said opening is not completely landed on said target is reduced; and
   d) depositing a conductive material into said opening such that said conductive material is electrically coupled to said target, said liner material confining said conductive material proximate to said target.

8. The method for forming an interconnect with reduced gouging as recited in claim 7 wherein said target is comprised of metal layer.

9. The method for forming an interconnect with reduced gouging as recited in claim 7 wherein said liner material is comprised of conformal material.

10. The method for forming an interconnect with reduced gouging as recited in claim 7 wherein said liner material is selected from the group consisting of oxide, nitride, and low-k materials.

11. The method for forming an interconnect with reduced gouging as recited in claim 7 wherein said etching process of step c) is comprised of a highly anisotropic etching process.

12. The method for forming an interconnect with reduced gouging as recited in claim 7 wherein said etching process of step c) ceases once said target is exposed.

13. The method for forming an interconnect with reduced gouging as recited in claim 7 wherein said conductive material is a metal material.

14. The method for forming an interconnect with reduced gouging as recited in claim 7 wherein step d) comprises depositing a plurality of conductive materials into said opening.

* * * * *